United States Patent [19]
Azuma

[11] Patent Number: 5,998,284
[45] Date of Patent: Dec. 7, 1999

[54] METHOD FOR MANUFACTURING SEMICONDUCTOR DEVICE

[75] Inventor: Kenichi Azuma, Tenri, Japan

[73] Assignee: Sharp Kabushiki Kaisha, Osaka, Japan

[21] Appl. No.: 08/803,753

[22] Filed: Feb. 21, 1997

[30] Foreign Application Priority Data

Mar. 25, 1996 [JP] Japan ................................ 8-067780
Dec. 4, 1996 [JP] Japan ................................ 8-323706

[51] Int. Cl.$^6$ ................................................ H01L 21/425
[52] U.S. Cl. ........................ 438/514; 438/530; 438/664
[58] Field of Search ............................... 438/514, 530, 438/550, FOR 149, FOR 154, FOR 174, 581, 582, 618, 648, 682, 683, 685, 583, 664

[56] References Cited

U.S. PATENT DOCUMENTS

| | | | |
|---|---|---|---|
| 4,551,908 | 11/1985 | Nagasawa et al. | 438/659 |
| 4,788,160 | 11/1988 | Havemann et al. | 438/305 |
| 4,845,047 | 7/1989 | Holloway et al. | 438/289 |
| 5,536,676 | 7/1996 | Cheng et al. | 438/535 |
| 5,610,099 | 3/1997 | Stevens et al. | 438/626 |
| 5,620,926 | 4/1997 | Itoh | 438/530 |

FOREIGN PATENT DOCUMENTS 06097110A 4/1994 Japan .
6-97110 4/1994 Japan .

OTHER PUBLICATIONS

Wolf, S., Tauber R.N.; Silicon Processing for the VLSI Era vol. 1: Process Technology, Lattice Press, Sunset Beach, CA, pp. 295–325.

Novel Low Leakage and Low Resistance Titanium Salicide Technology With Recoil Nitrogen Achieved by Silicidation After Ion Impjantation Through Contamination–Restrained Oxygen Free LPCVD–Nitride Layer (SICRON), H. Kotaki et al,; Extended Abstracts of the 1995 International Conference on Solid State Devices and Materials, Osaka, 1995, pp. 85–87.

Primary Examiner—John F. Niebling
Assistant Examiner—Christopher Lattin
Attorney, Agent, or Firm—Nixon & Vanderhye P.C.

[57] ABSTRACT

In a semiconductor device manufacturing method, when an impurity is implanted into a region for forming an impurity diffused layer in a silicon substrate, or into a polysilicon layer formed on the silicon substrate, the injection of the impurity is carried out through a protective film, such as a TiN film, which contains no oxygen and which is selectively removable from silicon. Thereafter, an annealing for activating the impurity thus implanted is applied so that an impurity diffused layer is formed, and the protective film is removed. Subsequently, a refractory metal film is adhesively provided on the silicon surface of the region where the impurity diffused layer is formed, and reaction between the silicon and the refractory metal film is caused by an annealing so that a refractory metal silicide film is formed. With this arrangement, it is possible to produce a semiconductor device which has a refractory metal silicide film having a low resistance.

19 Claims, 8 Drawing Sheets

METHOD FOR MANUFACTURING SEMICONDUCTOR DEVICE

FIELD OF THE INVENTION

The present invention relates to a method for manufacturing a semiconductor device, especially a manufacturing method including a step of forming a salicide (self-aligned silicide) containing such a refractory metal as Ti, Co, Ni, or Pt.

BACKGROUND OF THE INVENTION

In order to enhance an operating speed of a semiconductor device, generally it is necessary to decrease each capacitance and resistance which each semiconductor element constituting the semiconductor device has while it is in operation, for example, a capacitance of a gate oxide film, a junction capacitance, and a wiring resistance. For scale-down of the semiconductor devices, it is an important problem how a resistance in a source/drain region and a resistance of a gate electrode is decreased, among wiring resistances of the semiconductor element. It is considered that a sheet resistance is preferably made not higher than 10 $\Omega/\square$, if possible.

Conventionally, to make a gate electrode have a lower resistance, the gate electrode is arranged so as to have a two-layer configuration having a refractory metal such as tungsten, or a silicide of such a metal as one layer, and a polysilicon as the other layer. On the other hand, as a method of making the source/drain region have a lower resistance, an impurity implantation dose is increased, or an activation ratio of the impurity is raised by annealing at a higher temperature for activating the impurity.

However, with these above methods, since the impurity is more greatly diffused sideward, characteristics of a semiconductor device such as a transistor remarkably deteriorate due to the short channel effect or the like. To avoid this problem, a method is used whereby the impurity diffused layer, where the source/drain region is to be formed, is made thinner and is made to have a low resistance. Applied to this method is a technology for causing selective reaction between a refractory metal such as Ti and a silicon substrate so as to form silicide, namely, a so-called salicide forming technology. The following description will explain a method for forming an MOS FET (metal-oxide-semiconductor field effect transistor) to which the salicide forming technology is applied, with reference to FIGS. 8(a) through 8(d).

Figure 8A:
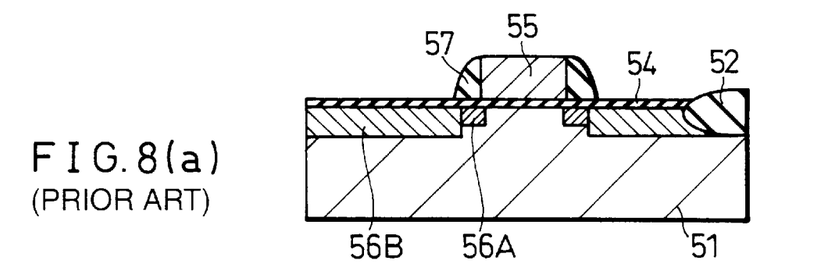
FIGS. 8(a) through 8(d) are cross-sectional views illustrating conventional steps of manufacturing a semiconductor device.

A gate electrode 55 made of polysilicon is formed on a p-type silicon substrate 51 on which an element isolating oxide film 52 is formed, with a gate insulating film 54 provided between the gate electrode 55 and the p-type silicon substrate 51.

Next, using the gate electrode 55 as a mask, an n-type impurity is implanted into the p-type silicon substrate 51 through the gate insulating film 54, so that a low dense impurity diffused layer 56A is formed. Thereafter, only on the side surfaces of the gate electrode 55, silicon oxide films 57 are formed. Furthermore, using the gate electrode 55 and the silicon oxide films 57 as masks, the n-type impurity is implanted into the low dense impurity diffused layer 56A through the gate insulating film 54 so that a high dense impurity diffused layer 56B is formed. As a result, an n-channel MOS transistor having an LDD structure (lightly doped drain structure) is formed, as shown in FIG. 8(a).

Figure 8B:
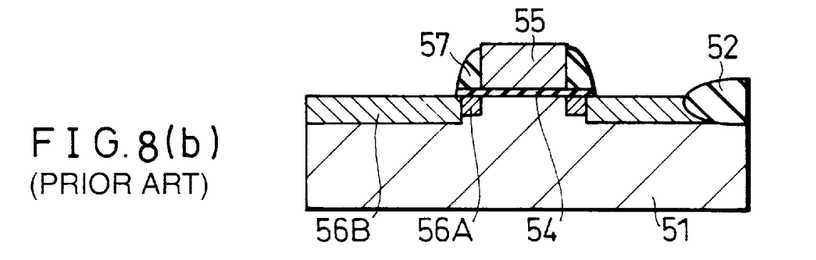
Figure 8C:
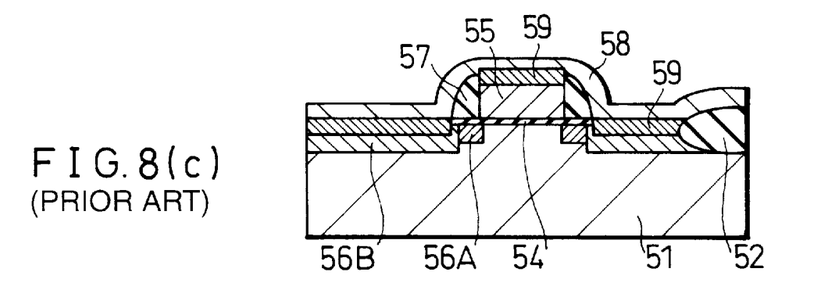

In the next stage, exposed parts of the gate insulating film 54 are removed, so as to expose the top surface of the gate electrode 55 and a surface of the high dense impurity diffused layer 56B formed in the p-type silicon substrate 51, as illustrated in FIG. 8(b). Then, Ti is deposited by a sputtering method or the like all over the exposed surface so that a Ti film 58 is formed thereon. Thereafter, an annealing is applied to it in a nitrogen atmosphere at a temperature of 500–700° C. for from 20 seconds to 1 minute, to cause reaction between Ti and silicon, that is, Ti film 58 and the high dense impurity diffused layer 56B. As a result, a TiSi$_x$ film 59 is formed, as shown in FIG. 8(c).

Figure 8D:
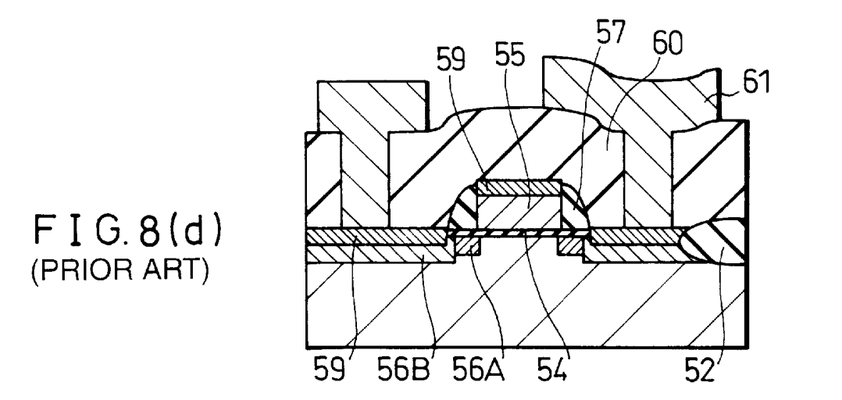

Thereafter, non-reacted Ti is removed, and an annealing at a temperature of 800–850° C. is applied. As a result, an n-channel MOS transistor having a source/drain region 56 with a low resistance and the gate electrode 55 is formed, as illustrated in FIG. 8(d). Finally, an interlayer insulating layer 60 and a metal wire 61 are formed, so that an n-channel MOS transistor as a semiconductor device is completed.

It is known that a refractory metal silicide film such as a TiSi$_x$ film 59 tends to agglomerate thereby having a high resistance, unless it is formed under suitable conditions. Especially, it is known that when an amount of oxygen contained in silicon to be reacted with Ti increases, the Ti silicide film formed by reaction between Ti and silicon tends to agglomerate, thereby having a high resistance. Therefore, in order to form a Ti silicide film having a low resistance, it is necessary that the density of oxygen contained in the silicon is lowered.

Such a phenomenon that the Ti silicide film has a higher resistance with the increase of oxygen in silicon to be reacted with Ti is remarkable especially in a high dense n-type impurity diffused region where As$^+$ is implanted. The reason seems that when As$^+$ is implanted, atoms of oxygen contained in the oxide film on the silicon substrate are knocked on by the ion beam and plunge into the inside of the silicon substrate, which is the so-called knock-on phenomenon of oxygen.

On the other hand, in a high dense p-type impurity diffused region, the mass number of the implanted ion can be reduced to about one fifth, by using not BF$_2^+$ but B$^+$ as implanted ion. Therefore, in this case, the amount of implanted ion oxygen introduced into the silicon by the knock-on phenomenon drastically decreases.

Therefore, another method whereby the impurity is implanted after the salicide formation process has been also considered. The following description will discuss the method.

First, a gate electrode is formed, then silicon oxide films are formed on side surfaces of the gate electrode, while a top surface of the gate electrode and a surface of an impurity-implanted region are exposed. Thereafter, a Ti film is formed so as to cover the exposed surfaces, and then an annealing at a temperature of from 500 to 700° C. is applied so that a Ti silicide film is formed.

Thereafter, As$^+$ is implanted through the Ti silicide film, for example, at an implantation dose of 5×10$^{15}$ ions/cm$^2$. After a non-reacted part of the Ti film is removed, an annealing for activation, for example, at a temperature of 900° C. for 10 minutes, is applied.

However, for the activation of the implanted ion, an annealing at a temperature of not lower than 850° C. for from 10 to 20 minutes is required, whereas an annealing under such conditions causes agglomeration of the Ti silicide, which increases a wire resistance especially at portions with a narrow wire width.

A method of preventing oxygen from being mixed with the salicide film during the silicide forming reaction is disclosed by the Japanese Publication for Laid-Open Patent Application No. 6-97110/1994 (Tokukaihei 6-97110). According to the method, after depositing Ti on the surface of the silicon substrate, an oxidation-resistant mask is formed thereon, and thereafter the silicide forming reaction is carried out, so that contamination by oxygen is prevented. However, though the method is effectual for preventing the contamination by oxygen during the salicide film forming process, the impurity implantation process for forming a high dense impurity diffused region in the silicon substrate is not described in the foregoing disclosure.

SUMMARY OF THE INVENTION

The object of the present invention is to provide a method of manufacturing a semiconductor, to which a technology for forming salicide is applied, and whereby a film made of a refractory metal silicide having a low resistance can be formed.

A semiconductor device manufacturing method of the present invention includes the steps if (a) implanting an impurity to silicon through a film (hereinafter referred to as protective film) for preventing the introduction of recoil oxygen in the silicon, the protective film being made of a refractory metal or a compound of a refractory metal which does not contain oxygen, (b) activating the impurity implanted into the silicon by applying an annealing so that an impurity diffused layer is provided, (c) providing a film made of a refractory metal so that the film is adherent to the impurity diffused layer, and (d) causing reaction between the impurity diffused layer and the refractory metal film by applying an annealing, so that a refractory metal silicide film is provided.

According to the above-described method, the impurity is implanted to the silicon through the injection protective film of a refractory metal or a refractory metal compound containing no oxygen. Therefore it is possible to suppress the knock-on phenomenon of oxygen during the impurity implantation for forming the impurity diffused layer. As a result, the density of oxygen in silicon is lowered, thereby ensuring that a refractory metal silicide of good quality is formed.

In addition, since the implantation of impurity to silicon is carried out with the surface of the silicon where the source/drain formation region is to be formed always covered with the protective film, the silicon is not contaminated, thereby ensuring that a semiconductor device having good junction characteristics can be obtained.

As a result, a miniature semiconductor device is enabled to have a source/drain region and a gate electrode having lower resistances, thereby ensuring that a semiconductor device which can conduct high speed operations is manufactured.

In the case where the ion implantation is carried out with the surface of the silicon substrate not covered with the protective film thereby being exposed, the knock-on phenomenon of oxygen can be suppressed, whereas leakage current increases compared with the case where the protective film is used.

However, since the foregoing method uses the protective film made of a refractory metal or a refractory metal compound containing no oxygen, it is possible to decrease leakage current as well as to suppress the knock-on phenomenon.

As material for the protective film used in the above method, a refractory metal, or a refractory metal compound containing no oxygen may be used. But, preferably used is a refractory metal which can be easily removed from the silicon, or the refractory metal compound containing no oxygen which can be easily removed from the silicon.

In the case where the refractory metal is used as a protective film, reaction is caused between the refractory metal and silicon and agglomeration occurs therein during the annealing for activating the impurity, thereby causing the silicon substrate to have a rough surface after the protective film is removed. Therefore, a refractory metal compound containing no oxygen such as TiN, which does not actively react with silicon, is preferable in particular as a protective film.

Furthermore, in the above method, the protective film may be removed before the annealing for activating the impurity is applied.

Regarding the foregoing method, in the case where the refractory metal or the refractory metal compound containing no oxygen is used as material for the protective film to be used during the impurity implantation, it is preferable that the impurity is implanted at an implantation dose of $1\times10^{15}$ ions/cm$^2$ to $5\times10^{15}$ ions/cm$^2$ so as to suppress the knock-on phenomenon during the ion implantation.

Another semiconductor device manufacturing method of the present invention includes the steps of (a) implanting an impurity to silicon at an implantation dose of not greater than $1\times10^{15}$ ions/cm$^2$ so as to provide an impurity diffused layer, (b) providing a film made of a metal having a refractory so that the film is adherent to silicon, and (c) causing reaction between the refractory metal film and silicon by applying an annealing, so that a refractory metal silicide film is provided.

By the above-described method, it is possible to suppress the knock-on phenomenon of oxygen during the impurity implantation for forming an impurity diffused layer which is to serve as a source/drain region, since according to the method the impurity is implanted to the silicon at an implantation dose of not greater than $1\times10^{15}$ ions/cm$^2$. This causes the silicon to contain a low density of oxygen, thereby ensuring that a refractory metal silicide film of a good quality is provided. Further, this enables a miniaturized semiconductor device to have a source/drain region and a gate electrode which have low resistances. Thus, by this method, it is possible to manufacture a semiconductor device which can conduct high speed operations.

Another semiconductor device manufacturing method of the present invention includes the steps of (a) implanting an impurity to exposed silicon, (b) activating the impurity implanted into the silicon by applying an annealing so that an impurity diffused layer is provided, (c) providing a refractory metal film so that the film is adherent to the impurity diffused layer, and (d) causing reaction between the impurity diffused layer and the refractory metal film by applying an annealing so that a refractory metal silicide film is provided.

According to the described method, the impurity is implanted to the silicon which is exposed. Therefore, it is possible to suppress the knock-on phenomenon of oxygen during the impurity implantation for forming the impurity diffused layer which is to serve as a source/drain region. This causes the silicon to contain a low density of oxygen, thereby ensuring that a refractory metal silicide film of a good quality is provided. Further, this enables a miniaturized semiconductor device to have a source/drain region and a gate electrode which have low resistances. Thus, by this method, it is possible to manufacture a semiconductor device which can conduct high speed operations.

For a fuller understanding of the nature and advantages of the invention, reference should be made to the ensuing

DESCRIPTION OF THE PREFERRED EMBODIMENTS

First Embodiment

The following description will discuss a manufacturing method of a semiconductor device in accordance with the present invention in detail, while referring to FIGS. 1(a) through 1(e). In the following description, a method for producing a MOS transistor is taken as an example.

Figure 1A:
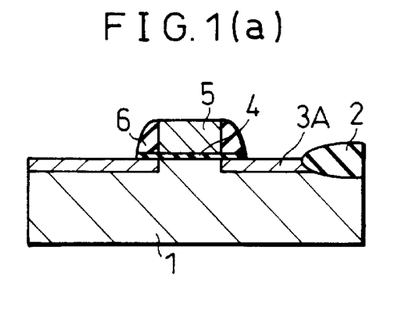
FIGS. 1(a) through 1(e) are cross-sectional views respectively illustrating steps for manufacturing a semiconductor device in accordance with one embodiment of the present invention.

A gate oxide film 4 is formed on a silicon substrate 1 having an element separating oxide film 2. Specifically, either pyrogenic oxidation or oxidation in an atmosphere of HCl or oxygen at a temperature of 700° C. to 900° C., is carried out with respect to the silicon substrate 1 so that a silicon oxide film with a thickness of 4 to 10 nm, namely, gate oxide film 4, is formed.

Subsequently, polysilicon is deposited on the gate oxide film 4 so as to have a thickness of 50 to 300 nm, by the usual CVD (chemical vapor deposition) method. Then, the polysilicon thus deposited is processed using the usual lithography technology and the usual RIE (reactive ion etching) method, so that a gate electrode 5 is formed. Note that in the present invention, the gate electrode 5 may be made of amorphous silicon, instead of polysilicon.

Using the gate electrode 5 as a mask, an n-type impurity, such as $P^+$, is implanted into the silicon substrate 1 with an implantation energy of 10 to 50 KeV at an implantation dose of $1 \times 10^{13}$ to $1 \times 10^{15}$ ions/cm$^2$, so that a low dense impurity diffused layer 3A of a source/drain region 3 is formed. Thereafter, the silicon oxide film is formed by the CVD method, and an etchback is carried out so that side wall spacers 6 are formed only on the side surfaces of the gate electrode 5 (see FIG. 1(a)).

Note that since here $P^+$ is used as implanted ion, the gate oxide film 4 which is a silicon oxide film is used as a protective film. On the other hand, in the case where $As^+$ is used as an implanted ion, the silicon oxide film is not preferably used as a protective film. Alternatively, preferably used as a protective film is a film made of a refractory metal such as Ti, Co, or Ni, or a film made of a compound of such a melting point metal.

Figure 1B:
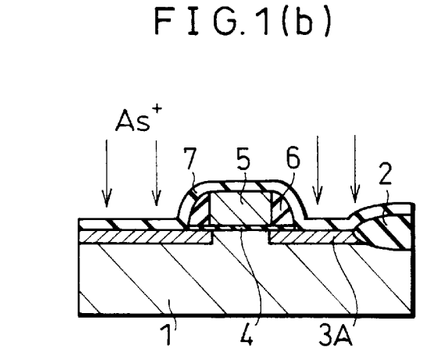
Figure 1C:
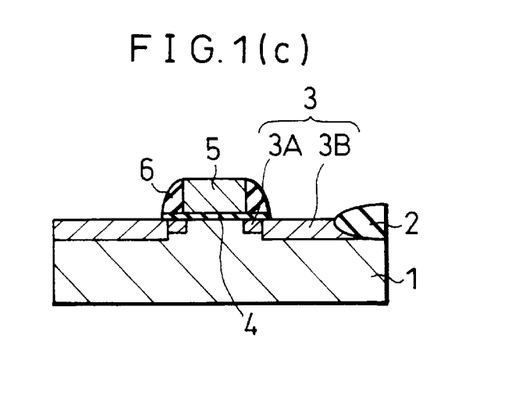

Subsequently, the silicon oxide film is removed by the use of HF solution or the like from the surfaces of the gate electrode 5 and the impurity-implanted region where the high dense impurity diffused layer 3B for the source/drain region 3 is formed, so that the surfaces of the gate electrode 5 and the silicon substrate 1 are exposed. Then, as shown in FIG. 1(b), a TiN film 7 as a protective film is formed by the CVD method or the reactive sputtering method.

Note that the protective film may be made of, instead of TiN, a refractory metal such as Ti, Co, or Ni, or a compound of such a refrectory metal not containing oxygen.

Then, $As^+$ is implanted through the TiN film 7 to the silicon substrate 1 with an implantation energy of 10 to 100 KeV at an implantation dose of $1 \times 10^{15}$ to $5 \times 10^{15}$ ions/cm$^2$.

Note that after exposing the surface of the silicon substrate 1, $As^+$ may be implanted in this state to the silicon substrate 1 with an implantation energy of 10 to 100 KeV at an implantation dose of $1 \times 10^{15}$ to $5 \times 10^{15}$ ions/cm$^2$. Here, "the silicon substrate 1 is exposed" means that "the silicon substrate 1 is completely exposed", or "a naturally-formed oxide film (a silicon oxide film of not more than several nanometers in thickness) is formed on the surface of the silicon substrate 1".

Alternatively, without removing the silicon oxide film by the use of the HF solution, $As^+$ may be implanted through the silicon oxide film to the silicon substrate 1 with an implantation energy of 10 to 100 KeV at an implantation dose of $5 \times 10^{14}$ to $1 \times 10^{15}$ ions/cm$^2$.

Thereafter, as shown in FIG. 1 (c), the TiN film 7 is removed with the use of sulfuric acid solution containing hydrogen peroxide or ammonia solution containing hydrogen peroxide. Then, an annealing for impurity activation is carried out at a temperature of 700 to 900° C. for 5 to 60 minutes, so as to form the source/drain region 3 composed of a low dense impurity diffused layer 3A and a high dense impurity diffused layer 3B.

Though here the annealing for the impurity activation is carried out after the removal of the protective film, the annealing may be carried out with the protective film remaining so that the impurity would not be diffused to outside during the annealing, and thereafter the protective film may be removed. Alternatively, after removing the protective film, another protective film for suppressing outward diffusion of the impurity during the annealing may be formed.

Figure 1D:
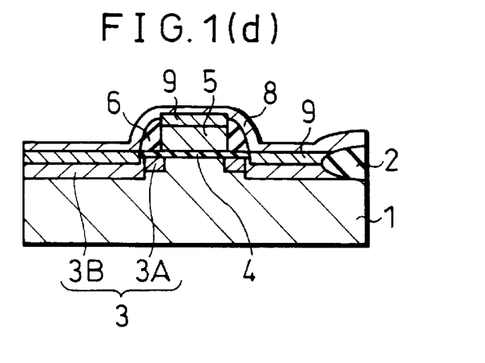

Thereafter, the surfaces of the gate electrode 5 and the silicon substrate 1 are exposed, and a refractory metal such as Ti which react,3 with silicon is deposited on the surfaces of the silicon substrate 1 and the gate electrode 5 by the sputtering method or the like, so as to form a Ti film (a refractory metal film) 8 with a thickness of 10 to 100 nm.

After the formation of the Ti film 8, a first annealing at a temperature of 600 to 700° C. for 10 to 100 seconds is carried out in a nitrogen atmosphere. As a result, a TiSi$_2$ film (refractory metal silicide film) 9 having a crystal structure C49 (resistivity: 50 to 60 $\mu\Omega$·cm) is formed on the high dense impurity diffused layer 3B and the gate electrode 5.

Due to the first annealing being carried out in the nitrogen atmosphere, Ti which did not react with anything during the silicide formation partly reacts with nitrogen, thereby forming a TiN film. Therefore, it is preferable that the steps from the deposition of Ti to the first annealing are sequentially carried out without exposing the substrate to an atmosphere containing oxygen (see FIG. 1(d)).

Figure 1E:
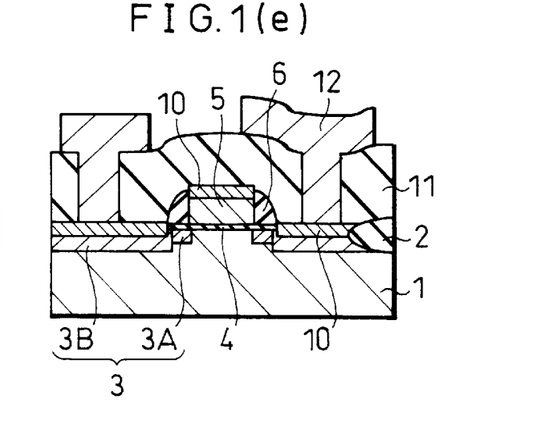

Thereafter, non-reacted Ti and the TiN film are selectively removed through a process with the use of sulfuric acid solution containing hydrogen peroxide or ammonia solution containing hydrogen peroxide. Then, a second annealing at a temperature of 800 to 900° C. for 5 to 20 seconds is carried out so that a phase transformation occurs to the TiSi$_2$ film 9 having the crystal structure C49, thereby transforming the TiSi$_2$ film 9 into a TiSi$_2$ film 10 having a crystal structure C54 (resistivity: 15 $\mu\Omega$·cm). Thereafter an interlayer insulation film 11 is formed in a usual manner, contact holes are opened, and metal wires 12 made of Al or the like are formed. Thus, a semiconductor shown in FIG. 1(e) is completed.

Figure 6:
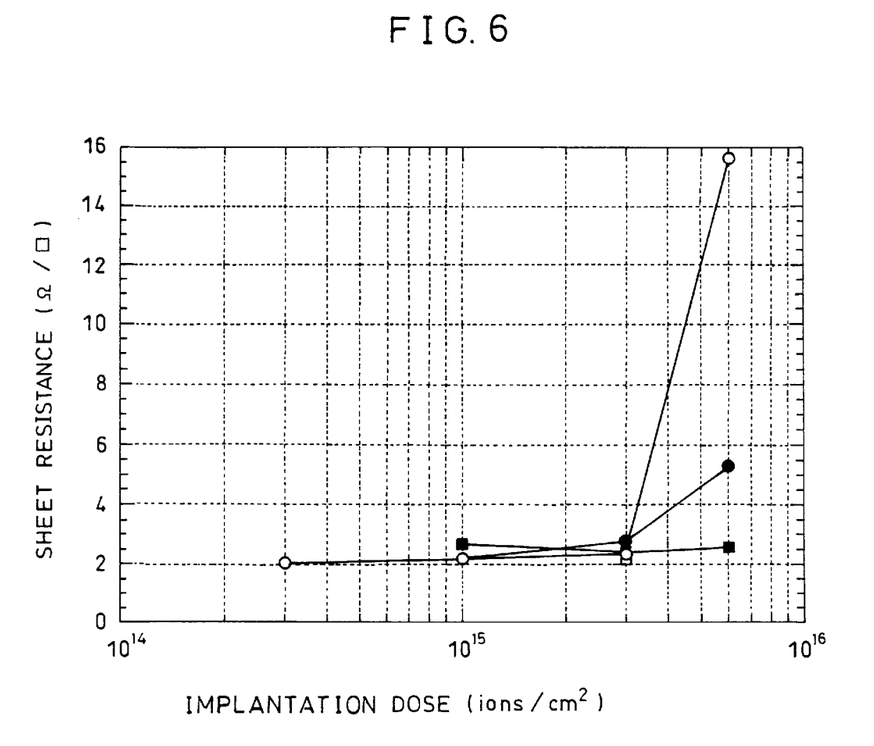
FIG. 6 is a graph regarding sheet resistances of Ti silicide films varying with implant doses of the impurity, in the case where a silicon oxide film is provided and in the case where it is not provided.
Figure 7A:
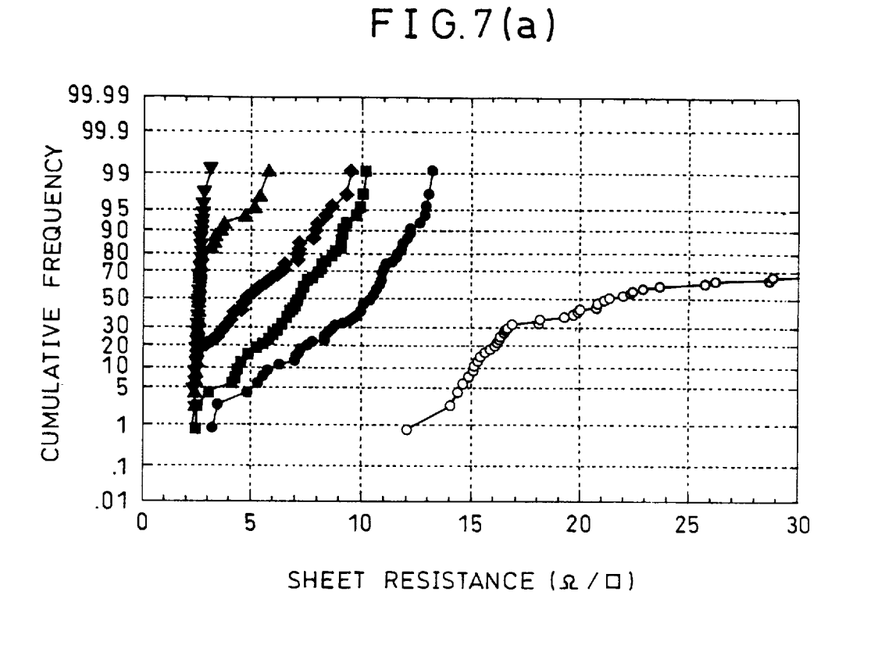
FIGS. 7(a) and 7(b) are graphs regarding sheet resistances of the Ti silicide films varying with the width of polysilicon to which the impurity is implanted.
Figure 7B:
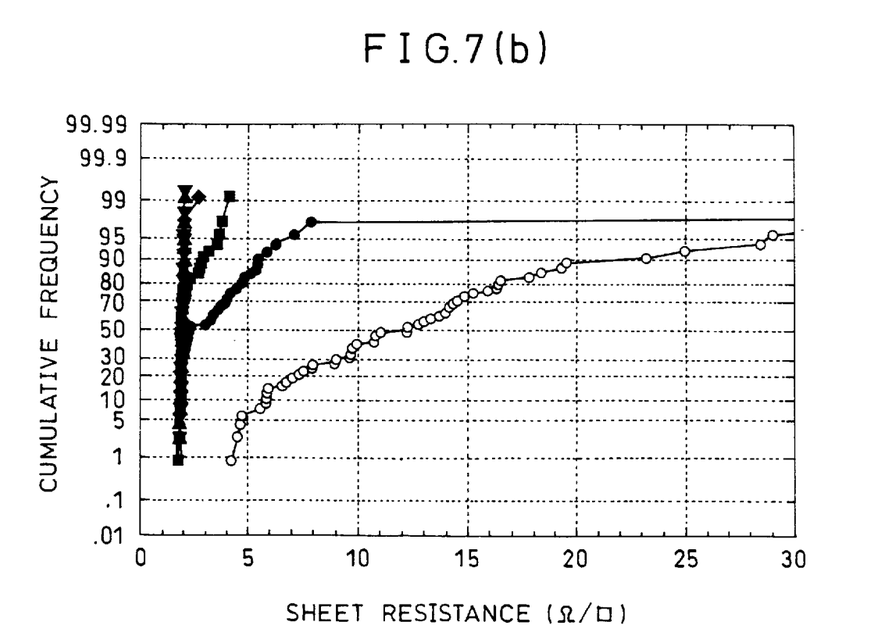

Regarding semiconductor devices which respectively have Ti silicide films which have been manufactured under different impurity implantation conditions, the following description will discuss sheet resistances of Ti silicide of the semiconductor devices, while referring to FIGS. 6 and 7.

Sheet resistances of Ti silicide films formed in the impurity-implanted regions of the silicon substrates were measured, in the case where a silicon oxide film was provided as a protective film, in the case where the surface of the silicon substrate was exposed, and in the case where a silicon nitride film and a Ti film were used as a protective films, respectively. The measured results are shown in FIG. 6. A sample for the above measurement was manufactured in the following manner. A silicon oxide film with a thickness of 20 nm was formed as a protective film on a p-type silicon substrate. As$^+$ was implanted through the silicon oxide film with an implantation energy of 50 KeV, and then, an annealing at a temperature of 900° C. was applied thereto for 5 minutes. Thereafter, the protective film was removed, Ti is deposited on the silicon substrate by a sputtering method so that a 55 nm thick Ti film is provided, and an annealing at a temperature of 650° C. weps applied thereto for 40 seconds. Non-reacted Ti, and TiN which had been formed as a result of reaction between Ti and Nitrogen, were removed, and an annealing at a temperature of 850° C. was applied thereto for 10 seconds. Thus, a sample having a Ti silicide with a thickness of 50 nm was formed.

The sheet resistances of the Ti silicide film of this sample are indicated by ○ in FIG. 6. As$^+$ was implanted to the above sample with an implantation energy of 10 KeV without a protective film (with only a naturally-formed oxide film) and sheet resistances of the Ti silicide film in this case are indicated by ● in the figure. As$^+$ was implanted to the above-described sample with an implantation energy of 30 KeV with a 10 nm thick silicon nitride film provided as the protective film, and sheet resistances of the Ti silicide film in this case are indicated by ■ in the figure. As$^+$ was implanted to the above-described sample with an implantation energy of 70 KeV with a 10 nm thick Ti film provided as a protective film, and sheet resistances of the Ti silicide film in this case are indicated by □ in the figure.

As shown in FIG. 6, the sample which was provided with the silicon nitride film as a protective film had the Ti silicide film having lower sheet resistances than those of the sample which was provided with the silicon oxide film as a protective film. However, it is not preferable that the silicon nitride film is directly formed on the silicon substrate, since in this case the surface of the silicon substrate may be roughed when the silicon nitride film is removed from the silicon substrate, and strain may be caused due to a difference between stress of the silicon nitrides film and that of the silicon substrate. Among all the samples, the sample which was provided with Ti as a protective film had a Ti silicide film having the lowest sheet resistances.

It is indicated by FIG. 6 that Ti silicide having low sheet resistances was obtained at an implantation dose of not greater than 3×10$^{15}$ ions/cm$^2$, regardless of the presence or absence of the protective film and the type of the protective film.

However, in the case where the silicon oxide film is used as a protective film, a satisfactory sheet resistance may not be obtained depending on the width of the gate electrode, particularly in the case where the miniaturization of the semiconductor device is attempted thereby causing the gate electrode to have a smaller width. This is a problem which does not occur in the case where a protective film used is made of a refractory metal or a compound of a refractory metal which does not contain oxygen.

FIGS. 7(a) and 7(b) illustrates gate electrode width dependency of sheet resistance of Ti silicide films. Each Ti silicide film used for the measurement shown in FIGS. 7(a) and 7(b) was formed in the following manner. A polysilicon film was formed on an insulating layer (silicon oxide film) having a thickness of 20 nm on a silicon substrate, so as to become 150 nm thick, and As$^+$ was implanted therein with an implantation energy of 50 KeV. Thereafter Ti was deposited on the polysilicon film by a sputtering method so that a 55 nm thick Ti film was formed, and an annealing at a temperature of 650° C. was applied for 40 seconds in an atmosphere of nitrogen. Then, non-reacted Ti, nitrogen, and TiN which had been formed as a result of reaction between Ti and Nitrogen were removed, and an annealing at a temperature 850° C. was applied thereto for 10 seconds. Thus, a 50 nm thick Ti silicide film was formed.

FIG. 7(a) illustrates sheet resistances of the Ti silicide films thus formed in the case where As$^+$ was implanted at an implantation dose of 3×10$^{15}$ ions/cm$^2$, whereas FIG. 7(b) illustrates sheet: resistances of the Ti silicide films in the case where As$^+$ was implanted at an implantation dose of 1×10$^{15}$ ions/cm$^2$. In FIGS. 7(a) and 7(b), measured results of the case where the gate electrode used had a width of 0.25 $\mu$m are indicated by ○, those of the case where the gate electrode used had a width of 0.3 $\mu$m are indicated by ●, those of the case where the gate electrode used had a width of 0.4 $\mu$m are indicated by ■, and those of the case where the gate electrode used had a width of 0.5 $\mu$m are indicated by ◆. The other marks indicate sheet resistances of the Ti silicide film in the case where the gate electrode had a width of 1 $\mu$m.

In the case where the implantation dose was 3×10$^{15}$ ions/cm$^2$, the sheet resistance of Ti silicide varied in a wider range as the gate electrode had a smaller width. Therefore, it is preferable that the implantation dose is not more than 1×10$^{15}$ ions/cm$^2$.

Second Embodiment

Figure 2A:
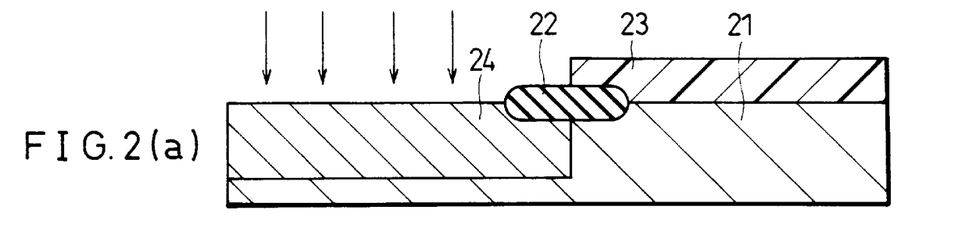
FIGS. 2(a) through 2(d) are cross-sectional views illustrating steps for manufacturing a semiconductor device in accordance with the embodiment of the present invention, in the case where the manufacturing method of the present invention is applied to a CMOS transistor manufacturing.
Figure 2B:
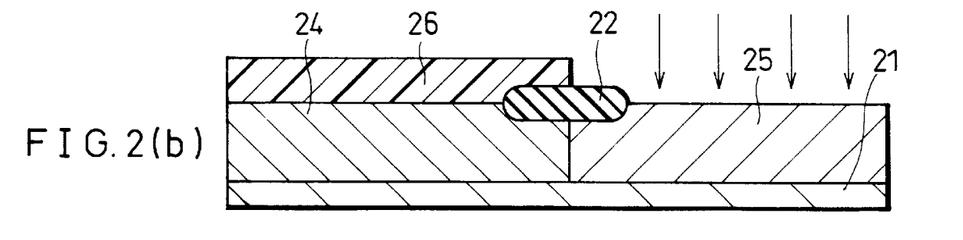
Figure 2C:
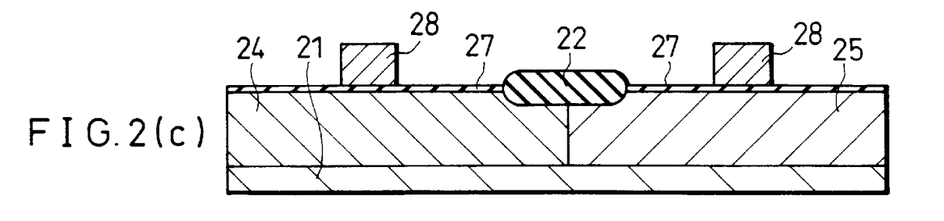
Figure 2D:
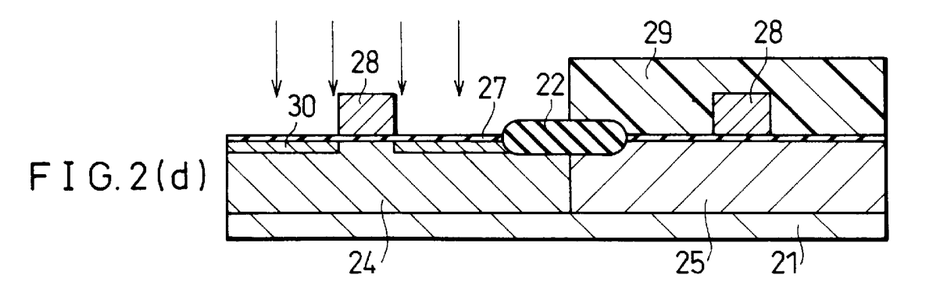
Figure 3A:
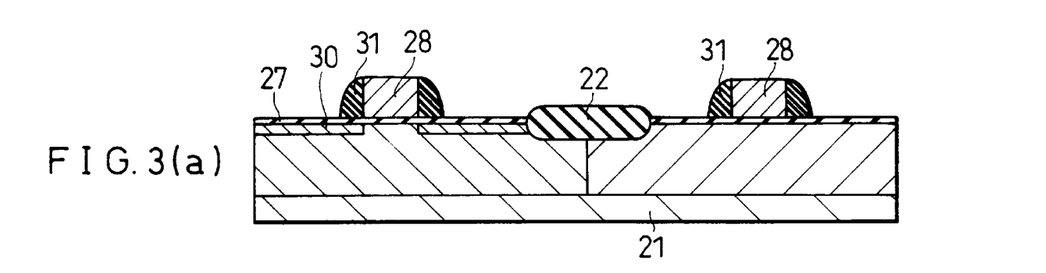
FIGS. 3(a) through 3(d) are cross-sectional views illustrating steps for manufacturing a semiconductor device in accordance with the embodiment of the present invention, in the case where the manufacturing method of the present invention is applied to a CMOS transistor manufacturing.
Figure 3B:
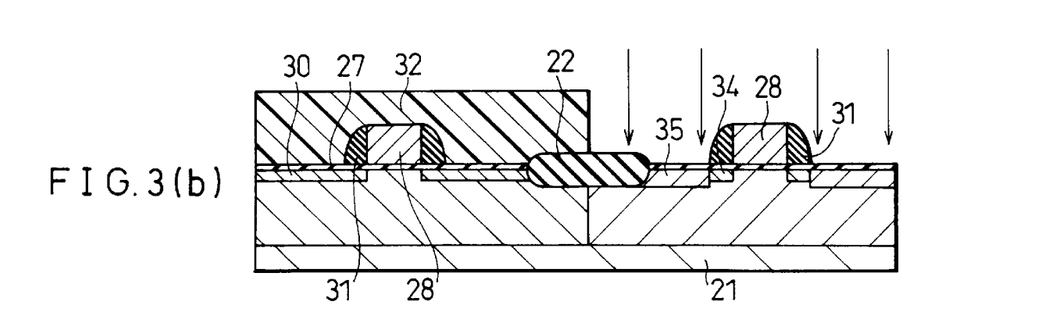
Figure 3C:
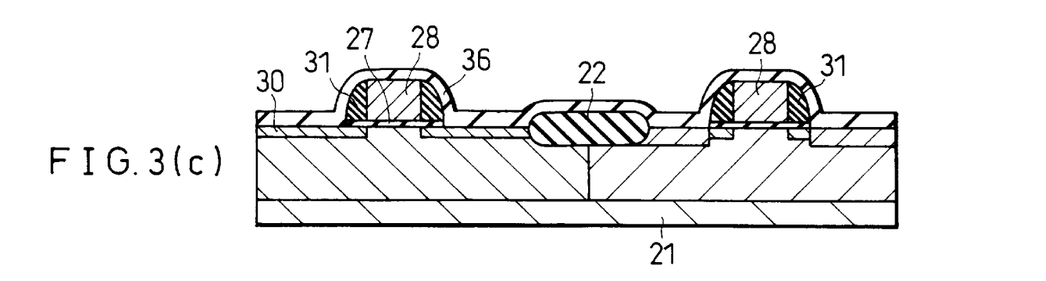
Figure 3D:
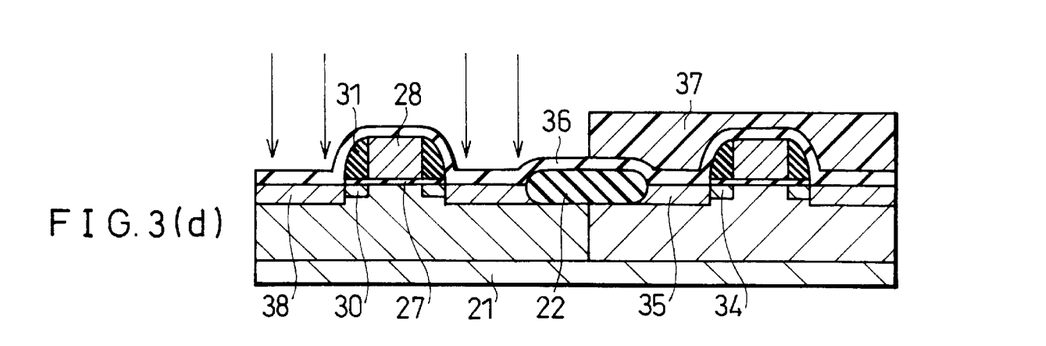
Figure 4A:
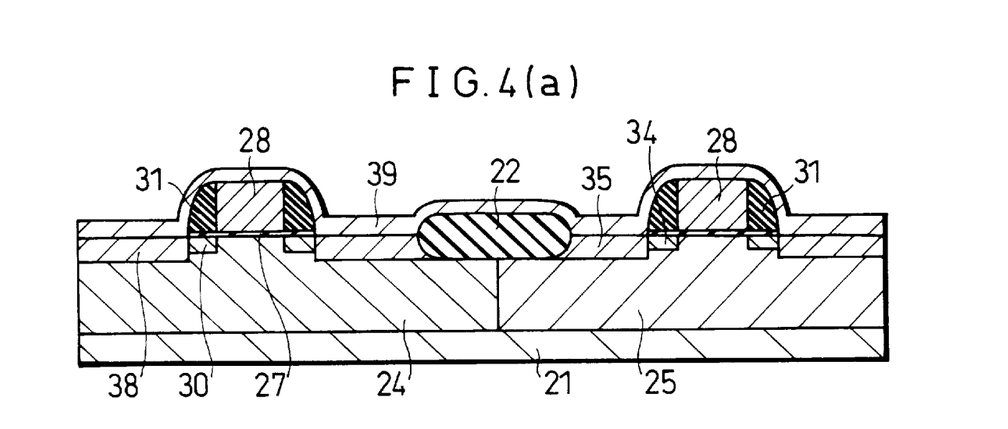
FIGS. 4(a) through 4(c) are cross-sectional views illustrating steps for manufacturing a semiconductor device in accordance with the embodiment of the present invention, in the case where the manufacturing method of the present invention is applied to a CMOS transistor manufacturing.
Figure 4B:
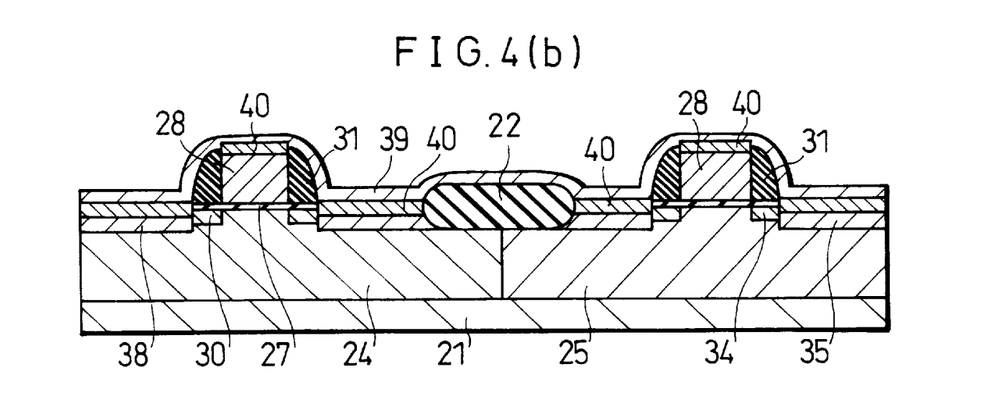
Figure 4C:
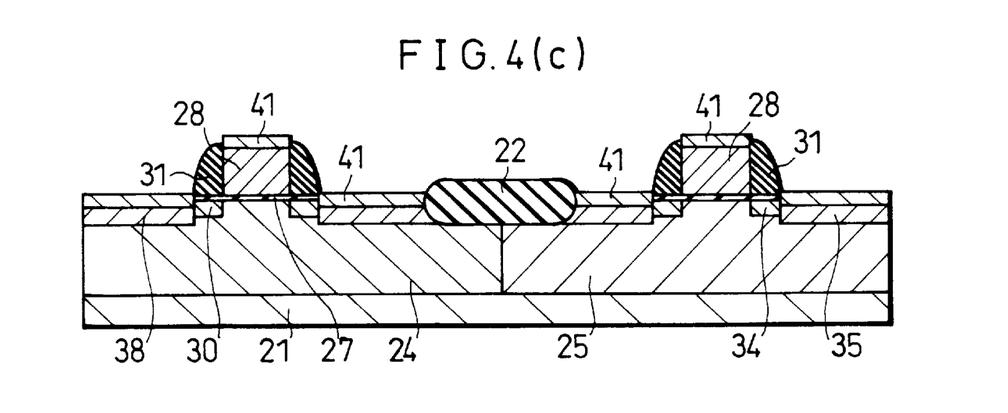

The following description will discuss a method of forming a CMOS transistor to which the manufacturing method of the present invention is applied, with reference to FIGS. 2 through 4.

First of all, as shown in FIG. 2(a), after an element isolating oxide film 22 is formed on a silicon substrate 21 by the usual selective oxidation method, a photoresist 23 is formed in a region for forming a PMOS transistor (hereinafter referred to as PMOS transistor region) on the silicon substrate 21 by the usual lithography technology.

Subsequently, $^{11}B^+$ is implanted in the NMOS transistor region of the silicon substrate 21 with an implantation energy of 50 to 300 KeV at an implantation dose of $1\times10^{12}$ to $5\times10^{13}$ ions/cm$^2$ so that a p-type well 24 is formed therein. Note that a multistep implantation of $^{11}B^+$ may be conducted with different implantation energies and different implantation doses, when necessary. Thereafter, in order to adjust a threshold voltage (Vth), $^{11}B^+$ is implanted with an implantation energy of 5 to 50 KeV at an implantation dose of $1\times10^{11}$ to $1\times10^{13}$ ions/cm$^2$.

Then, after removing the photoresist 23, a photoresist 26 is formed on a region for forming an NMOS transistor (hereinafter referred to as NMOS transistor region) on the silicon substrate 21 by the usual lithography technology, as shown in FIG. 2(b). Then, $^{31}P^+$ is implanted with an implantation energy of 100 to 800 KeV at an implantation dose of $1\times10^{12}$ to $5\times10^{13}$ ions/cm$^2$, so that an n-type well 25 is formed on the PMOS transistor region. Note that a multistep implantation of $^{11}P^+$ may be conducted with different implantation energies and different implantation doses, if necessary. Furthermore, in order to adjust a threshold voltage (Vth), $^{31}P^+$ is implanted with an implantation energy of 20 to 100 KeV at an implantation dose of $1\times10^{11}$ to $1\times10^{13}$ ions/cm$^2$. Note that the p-type well and the n-type well may be formed in a reverse order.

Then, after removing the photoresist 26, all the oxide films including a naturally formed oxide film on the silicon surface of an element formation region are removed, a gate oxide film 27 is formed, and polysilicon is formed on the gate oxide film 27.

Oxidation in an HCl atmosphere, in a gas containing nitrogen oxide, or in an oxygen atmosphere, or pyrojenic oxidation, at a temperature of 700 to 900° C., is applied so as to form the gate oxide film 27. As a result, for example, a silicon oxide film with a thickness of 5 nm is formed.

Polysilicon is deposited on the gate oxide film 27 so as to be 150 nm thick, by the usual CVD method. The usual lithography technology and the RIE technology are used for processing the polysilicon, so that gate electrodes 28 are formed (see FIG. 2(c)).

Subsequently, after a photoresist 29 is formed on the PMOS transistor region by the usual lithography technology, an implantation (LDD injection) for forming a low dens impurity diffused layer for the NMOS transistor (LDD layer) 30 is carried out, and furthermore, a halo implantation is carried out with respect to a channel region. The LDD implantation is carried out under the following conditions: $^{31}P^+$ is implanted with an implantation energy of 10 to 50 KeV at an implantation dose of $1\times10^{13}$ to $1\times10^{15}$ ions/cm$^2$. The harrow implantation is carried out under the following conditions: $^{11}B^+$ is implanted with an implantation energy of 10 to 50 KeV at an implantation dose of $1\times10^{11}$ to $1\times10^{13}$ ions/cm$^2$. If necessary, a tilt implantation or a step implantation may be carried out (see FIG. 2(d)).

Then, after removing the photoresist 29, an HTO film with a thickness of 100 to 120 nm is formed by the CVD method, etchback is carried out by the use of a usual anisotropic RIE, so that side wall spacers 31 are formed as shown in FIG. 3(a).

Subsequently, a photoresist 32 is formed in the NMOS transistor region by the usual lithography technology. Then, an implantation for forming an LDD layer 34 of the PMOS transistor, a halo implantation, and an implantation for forming a high dense impurity diffused layer 35 in a source/drain region are carried out.

For forming the LDD layer 34, $^{11}B^+$ is implanted with an implantation energy of 10 to 30 KeV at an implantation dose of $1\times10^{11}$ to $1\times10^{13}$ ions/cm$^2$, by a tilt implantation method or a rotational implantation method if necessary. The halo implantation is carried out under the following conditions: a tilt implantation or a rotational implantation of $^{31}P^+$ is carried out with an implantation energy of 20 to 80 KeV at an implantation dose of $1\times10^{11}$ to $1\times10^{13}$ ions/cm$^2$ (see FIG. 3 (b)). For the formation of the high dense impurity diffused layer 35 and a simultaneously-held doping with respect to the gate electrode 28, $^{11}B^+$ is implanted with an implantation energy of 1 to 20 KeV at an implantation dose of $1\times10^{15}$ to $5\times10^{15}$ ions/cm$^2$. Note that in the case where the implantation dose is low within the above range, $BF_2^+$ may be substituted for $^{11}B^+$.

Then, after removing the photoresist 32, the oxide film is removed from a region where salicide is to be formed, with the use of HF solution at a concentration of 1 percent or the like. Thereafter, TiN is deposited so as to become 5 to 50 nm thick by the usual CVD method or the usual reactive sputtering method, so that a TiN film 36 used as a protective film is formed as shown in FIG. 3(c).

Thereafter, as illustrated in FIG. 3(d), a photoresist 37 is formed in the PMOS transistor region by the usual lithography technology. Then, for the formation of a high dense impurity diffused layer 38 and the doping with respect to the gate electrode 28, $^{75}As^+$ is implanted through the TIN film 36 to the silicon substrate (p-type well 24 and the low dense impurity diffused layer 30) with an implantation energy of 10 to 100 KeV at an implantation dose of $1\times10^{15}$ to $5\times10^{15}$ ions/cm$^2$. Thereafter, the photoresist 37 is removed.

Note that in the present embodiment, the implantation of As$^+$ may be carried out after the surface of the silicon substrate is exposed. Alternatively, the implantation of As$^+$ may be carried out at an implantation dose of not more than $1\times10^{15}$ ions/cm$^2$, without removing the gate oxide film 27 by the use of the HF solution or the like. In these cases, the conditions of the ion implantation are the same as those in the first embodiment.

Subsequently, before or after the TiN film 36 formed on the surface of the substrate is removed by the solution processing, an annealing at a temperature of 700 to 900° C. is carried out for 5 to 60 minutes for the impurity activation. Then, a naturally-formed oxide film is removed from a region of the substrate surface where salicide is formed and the substrate surface is exposed. Thereafter, Ti is deposited thereon, so that a Ti film 39 with a thickness of 10 to 100 nm is formed (see FIG. 4(a)).

Subsequently, after forming the Ti film 39, a first annealing at a temperature of 600 to 700° C. in a nitrogen atmosphere is applied for 10 to 100 seconds. As a result, a TiSi$_2$ film 40 having a crystal structure C49 is formed on the high dense impurity diffused layers 35 and 38 and the gate electrodes 28, as shown in FIG. 4(b). Then, non-reacted Ti and the TiN film are selectively removed by the solution processing, and a second annealing at a temperature of 800 to 900° C. is applied for 5 to 20 seconds. As a result, a CMOS transistor having the TiSi$_2$ film 41 with a low resistance is formed (see FIG. 4(c)).

Third Embodiment

Figure 5A:
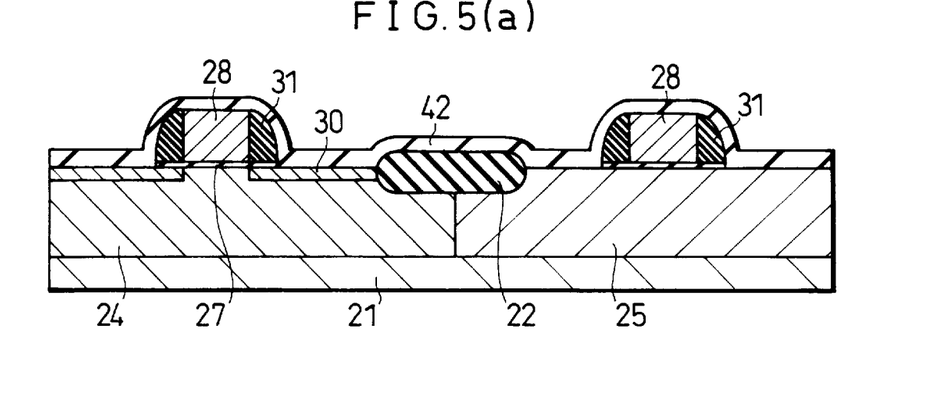
FIGS. 5(a) through 5(c) are cross-sectional views illustrating steps for manufacturing a semiconductor device in accordance with another embodiment of the present invention, in the case where the manufacturing method of the present invention is applied to a CMOS transistor manufacturing.

In the above-described second embodiment, the impurity implantation for forming the source/drain region of the PMOS transistor was carried out through the gate oxide film 27. The impurity implantation can also be carried out through the protective film, as is the case with the impurity implantation for the NMOS transistor. A manufacturing method in this case is shown in FIGS. 5(a) through 5(c).

The present embodiment has the same steps until the side wall spacers 31 are formed as those in the second embodiment shown in FIG. 3(a). After the formation of the side wall spacers 31, the gate oxide film 27 is removed by the solution processing (for example, with the use of the HF solution having a concentration of 1 percent) from the region where salicide is to be formed. Then, TiN is deposited over the surface by the usual CVD method or the usual reactive sputtering method so as to become 5 to 50 nm thick. Thus, a TiN film 42 is formed (see FIG. 5(a)).

Figure 5B:
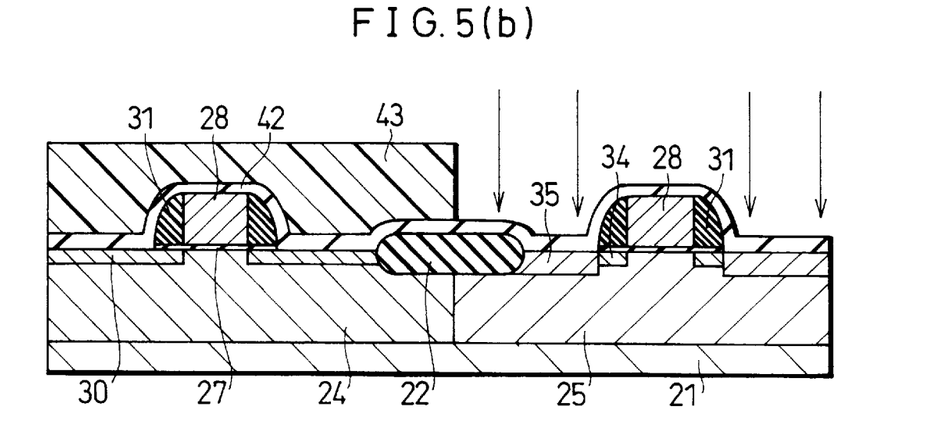
Figure 5C:
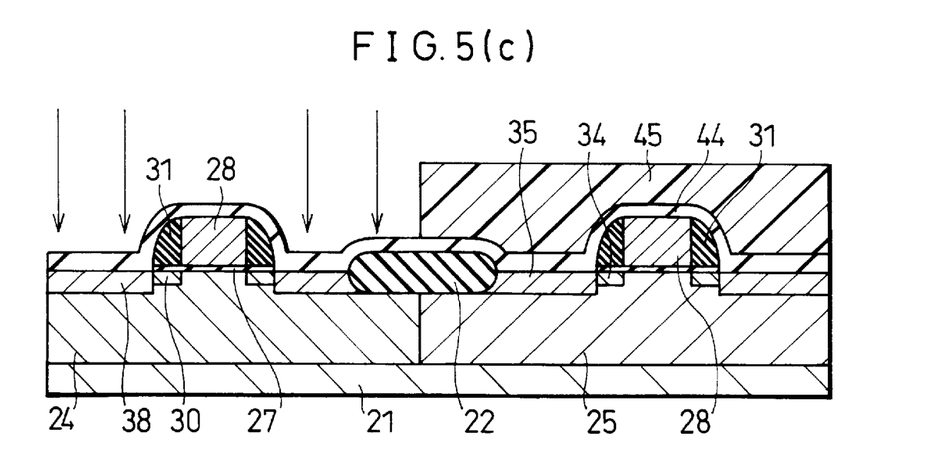

Subsequently, after a photoresist 43 is formed by the usual lithography technology in the NMOS transistor region, the LDD implantation, the harrow implantation, and the implantation for forming the high dense impurity diffused layer 35 for the source/drain region are carried out for forming the PMOS transistor, as shown in FIG. 5(b). The respective implantations are carried out under the same conditions as those in the second embodiment.

Then, after the photoresist 43 and the TiN film 42 are removed, TiN is again deposited over the surface by the usual CVD method or the usual reactive sputtering method so as to become 1 to 50 nm thick. Thus, a TiN film 44 is formed. Then, a photoresist 45 is formed by the usual lithography technology in the PMOS transistor region, and an ion implantation for forming a high dense impurity diffused layer 38 in the source/drain region of the NMOS transistor and for the doping with respect to the gate electrode 28 is carried out as follows: $^{75}As^+$ is implanted through the TiN film 44 to the silicon substrate (the p-type well 24 and the low dense impurity diffused layer 30) with an implantation energy of 10 to 100 KeV at an implantation dose of $1 \times 10^{15}$ to $5 \times 10^{15}$ ions/cm$^2$ (see FIG. 5(c)).

Thereafter, the formation of a (CMOS transistor is completed through the same steps as those in the second embodiment.

Thus, in the present embodiment, the TiN film 42 used as a protective film was removed after the implantation of the p-type impurity and TiN was deposited over the surface. However, the TiN film 42 may not be removed, and a treatment for enhancing the adhesion of the TiN film 42 may be applied over the surface of the TiN film 42 after removing the photoresist 43. Thus, the protective film used during the implantation process of the p-type impurity may be used as a protective film during the implantation process of the n-type impurity. With this arrangement, it is possible to simplify the manufacturing process.

In the present embodiment, the n-type impurity is implanted after the p-type impurity is implanted, but the p-type impurity may be implanted after the n-type impurity is implanted.

Furthermore, in the present embodiment, As$^+$ is implanted at an implantation dose of $1 \times 10^{15}$ to $5 \times 10^{15}$ ions/cm$^2$. However, by setting the implantation dose of As$^+$ to not greater than $1 \times 10^{15}$ ions/cm$^2$, it is enabled to suppress the knock-on phenomenon of oxygen and to form a refractory metal silicide film of a good quality by the conventional manufacturing method illustrated in FIGS. 8(a) through 8(d), even though a silicon oxide film is used as a protective film. Note that since the salicide formation technology is used, the resistance of the source/drain region can be lowered, even though the implantation dose of As$^+$ is reduced to not greater than $1 \times 10^{15}$ ions/cm$^2$.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing a semiconductor device, comprising the steps of:
   (a) implanting an impurity to silicon through a protective film made of a refractory metal or a refractory metal compound which does not contain oxygen;
   (b) removing the protective film, and thereafter activating the impurity implanted into the silicon by applying an annealing so that an impurity diffused layer is provided;
   (c) providing a refractory metal film so that the film is adherent to the impurity diffused layer and thereafter causing reaction between the impurity diffused layer and the refractory metal film by applying annealing, so that a refractory metal silicide film having a crystal structure C49 is provided; and
   (d) removing an unreacted part of the refractory metal film which has not been phase-transitioned into crystal structure C49 in step (c), and thereafter phase-transitioning the refractory metal silicide film having a crystal structure C49 into that having a crystal structure C54 by applying a second annealing.

2. A method as set forth in claim 1, further comprising the step of removing a non-reacted part of the refractory metal and refractory metal compounds other than the refractory metal silicide, after said step (d).

3. A method as set forth in claim 1, further comprising the step of removing the protective film, before said step (b).

4. The method as set forth in claim 1, wherein the silicon is a silicon substrate, a silicon layer provided on the silicon substrate, or the both.

5. The method as set forth in claim 1, wherein the impurity is implanted at an implantation dose of $1 \times 10^{15}$ ions/cm$^2$ to $5 \times 10^{15}$ ions/cm$^2$.

6. The method as set forth in claim 1, wherein the protective film is made of a nitride of a refractory metal.

7. The method as set forth in claim 1, wherein the protective film is made of a nitride of at least one refractory metal selected among Ti, Co, and Ni.

8. The method as set forth in claim 1, wherein the protective film is made of TiN.

9. The method as set forth in claim 1, wherein the protective film is made of at least one refractory metal selected among Ti, Co, and Ni.

10. The method as set forth in claim 1, wherein the refractory metal film is made of at least one metal among Ti, Mo, W and Pt.

11. The method as set forth in claim 1, wherein the impurity is an n-type impurity.

12. The method as set forth in claim 1, wherein the impurity is As$^+$.

13. A method for manufacturing a semiconductor device, comprising the steps of:
   (a) implanting a first impurity to a source/drain region and/or a gate electrode of a first conductive transistor through a protective film made of a refractory metal or a refractory metal compound containing no oxygen;
   (b) removing the protective film, and thereafter activating the first impurity by applying an annealing, so that a first impurity diffused layer is provided;
   (c) applying a treatment for enhancing adhesion of the protective film;

(d) implanting a second impurity to a source/drain region and/or a gate electrode of a second conductive transistor through the protective film to which the treatment for enhancing adhesion has been applied;

(e) activating the second impurity by applying a first annealing, so that a second impurity diffused layer is provided;

(f) providing a refractory metal film so that the film is adherent to the first and second impurity diffused layers and thereafter causing creation between the first and second impurity diffused layers and the refractory metal film, so that a refractory metal silicide film having a crystal structure C49 is provided; and (g) removing an unreacted part of the refractory metal film which has not been phase-transitioned into crystal structure C49 in step (f), and thereafter phase-transitioning the refractory metal silicide film having a crystal structure C49 into that having a crystal structure C54 by applying a second annealing.

14. The method as set forth in claim 13, wherein one of the first and second impurities is an n-type impurity, while the other is a p-type impurity.

15. A method for manufacturing a semiconductor device, comprising the steps of:

(a) implanting an impurity to exposed silicon;

(b) activating the impurity implanted into the silicon by applying an annealing so that an impurity diffused layer is provided;

(c) providing a film made of a refractory metal so that the film is adherent to the impurity diffused layer and thereafter causing reaction between the impurity diffused layer and the refractory metal film by applying a first annealing so that a refractory metal silicide film having a crystal structure C49 is provided; and (d) removing an unreacted part of the refractory metal film which has not been phase-transitioned into crystal structure C49 in step (c), and thereafter phase-transitioning the refractory metal silicide film having a crystal structure C49 into that having a crystal structure C54 by applying a second annealing.

16. A method as set forth in claim 15, further comprising the step of removing a non-reacted part of the refractory metal, and refractory metal compounds other than the refractory metal silicide, after said step (d).

17. The method as set forth in claim 15, wherein the silicon is a silicon substrate, a silicon layer provided on the silicon substrate, or the both.

18. A method for manufacturing a semiconductor device, comprising the steps of:

(a) implanting an impurity to silicon through a protective film made of a refractory metal or a refractory metal compound which does not contain oxygen;

(b) activating the impurity implanted into the silicon by applying an annealing, and thereafter removing the protective film, so that an impurity diffused layer is provided;

(c) providing a refractory metal film so that the film is adherent to the impurity diffused layer and thereafter causing reaction between the impurity diffused layer and the refractory metal film by applying a first annealing, so that a refractory metal silicide film having a crystal structure C49 is provided; and (d) removing an unreacted part of the refractory metal film which has not been phase-transitioned into crystal structure C49 in step (c), and thereafter phase-transitioning the refractory metal silicide film having a crystal structure C49 into that having a crystal structure C54 by applying a second annealing.

19. A method for manufacturing a semiconductor device, comprising the steps of:

(a) implanting a first impurity to a source/drain region and/or a gate electrode of a first conductive transistor through a protective film made of a refractory metal or a refractory metal compound containing no oxygen;

(b) activating the first impurity by applying an annealing, and thereafter removing the protective film, so that a first impurity diffused layer is provided;

(c) applying a treatment for enhancing adhesion of the protective film;

(d) implanting a second impurity to a source/drain region and/or a gate electrode of a second conductive transistor through the protective film to which the treatment for enhancing adhesion has been applied;

(e) activating the second impurity by applying a first annealing, so that a second impurity diffused layer is provided;

(f) providing a refractory metal film so that the film is adherent to the first and second impurity diffused layers and thereafter causing reaction between the first and second impurity diffused layers and the refractory metal film, so that a refractory metal silicide film having a crystal structure C49 is provided; and (g) removing an unreacted part of the refractory metal film which has not been phase-transitioned into crystal structure C49 in step (f), and thereafter phase-transitioning the refractory metal silicide film having a crystal structure C49 into that having a crystal structure C54 by applying a second annealing.

* * * * *